United States Patent [19]

Sonnenberg

[11] Patent Number: 4,649,353
[45] Date of Patent: Mar. 10, 1987

[54] FREQUENCY SYNTHESIZER MODULATION RESPONSE LINEARIZATION

[75] Inventor: John R. Sonnenberg, San Diego, Calif.

[73] Assignee: Motorola, Inc., Schaumburg, Ill.

[21] Appl. No.: 717,353

[22] Filed: Mar. 29, 1985

[51] Int. Cl.⁴ ............................................. H03L 7/18
[52] U.S. Cl. .......................................... 331/8; 331/16; 331/17; 331/25
[58] Field of Search ................... 331/8, 16, 17, 25, 27; 307/516, 525, 526; 328/133, 134, 155

[56] References Cited

U.S. PATENT DOCUMENTS

| 3,579,281 | 5/1971 | Kam et al. | 331/17 X |
| 3,694,776 | 9/1972 | Linder | 333/17 |
| 4,151,473 | 4/1979 | Coleman et al. | 331/27 X |
| 4,156,855 | 5/1979 | Crowley | 331/1 A |
| 4,167,711 | 9/1979 | Smoot | 331/17 |
| 4,243,941 | 1/1981 | Zdunek | 329/50 |
| 4,310,804 | 1/1982 | Ryon | 331/1 A |
| 4,330,758 | 5/1982 | Swisher et al. | 331/1 A |
| 4,392,113 | 7/1983 | Jackson | 331/8 X |
| 4,442,412 | 4/1984 | Smith et al. | 331/17 X |

FOREIGN PATENT DOCUMENTS 1529116 10/1978 United Kingdom .

OTHER PUBLICATIONS

"Phase-Frequency Detector MC4344.MC4044" Motorola Inc., 1972.

Primary Examiner—Siegfried H. Grimm
Attorney, Agent, or Firm—Steven G. Parmelee; Donald B. Southard

[57] ABSTRACT

In accordance with the present invention, there is provided a method of substantially flattening the modulation response in a frequency synthesizer. The method includes the steps of generating a synthesized frequency in response to a filtered control signal; scaling the synthesized frequency with a scalar; generating a control signal, having a response substantially the reciprocal of the frequency generation response, and indicative of the phase relationship between a reference frequency and the scaled, synthesized frequency; and filtering the control signal, whereby the interaction of the phase relationship control signal response and the frequency generation response approximates a flat modulation response.

6 Claims, 6 Drawing Figures

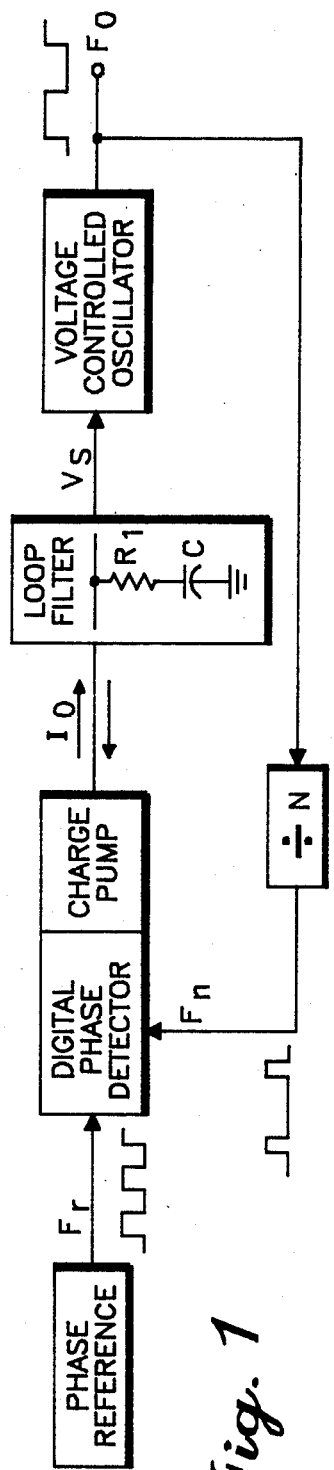
Fig. 1
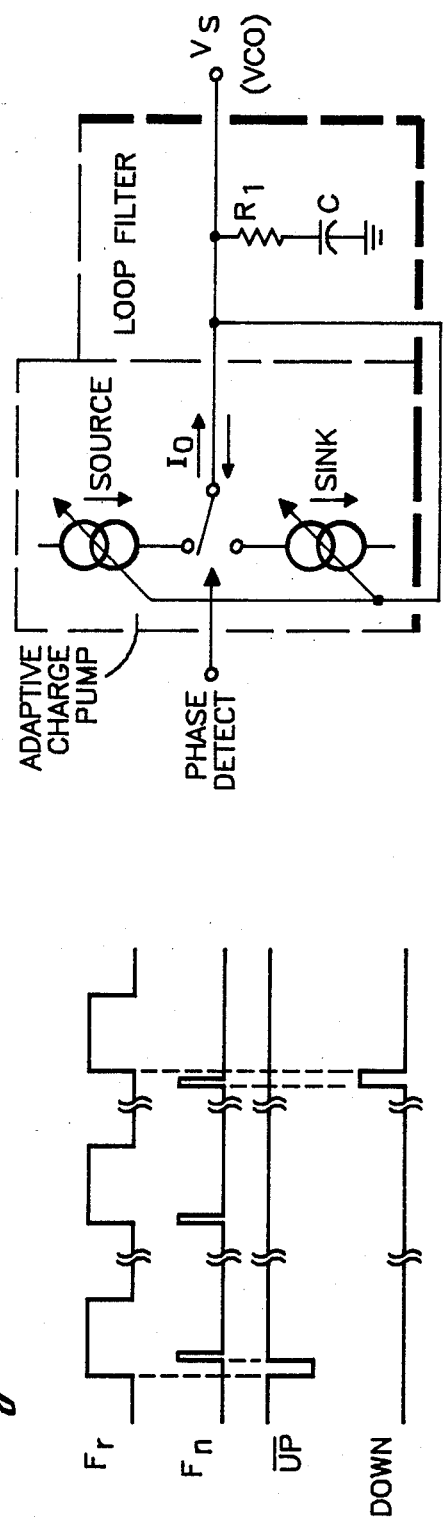
Fig. 3
Fig. 2

FREQUENCY SYNTHESIZER MODULATION RESPONSE LINEARIZATION

THE FIELD OF INVENTION

The invention disclosed herein is, generally, concerned with phase-locked loop frequency synthesizers.

More particularly, this invention relates to flat modulation response, wide bandwidth frequency synthesizers.

BACKGROUND OF THE INVENTION

The need for this invention arose from problems of obtaining flat modulation response in frequency synthesizers having nonlinear, wide bandwidth Voltage Controlled Oscillators (VCOs).

Others have attempted to solve the problem by utilizing dual response adaptive loops—one response optimized for frequency acquisition and one response optimized for flat modulation response—or, alternatively, by linearizing the VCO.

However, the problems were not entirely solved because adaptive loops that are optimized are optimized at a narrow loop bandwidth and, alternatively, linearization of the VCO is relatively expensive.

The instant invention solves the problem by flattening the modulation response by providing constant loop gain through compensation of the nonlinear VCO gain with a substantially reciprocal or multiplicatively inverse gain.

This invention represents a measurable advance over the prior art and over this technical field by providing a constant gain, wide bandwidth frequency synthesizer.

BRIEF SUMMARY OF THE INVENTION

It is the object of the present invention to provide a constant gain, wide bandwidth frequency synthesizer.

It is a further object of the invention to provide a relatively flat modulation response over the entire VCO steering line voltage range.

Another object of the present invention is to provide a relatively low cost, constant gain, wideband frequency synthesizer.

The ultimate object is to provide a relatively low cost, constant gain, wide bandwidth frequency synthesizer having a relatively flat modulation response over the entire VCO steering line voltage range.

In accordance with the present invention, there is provided a method of substantially flattening the modulation response in a frequency synthesizer. The method includes the steps of generating a synthesized frequency in response to a filtered control signal; scaling the synthesized frequency with a scalar; generating a control signal, having a response substantially the reciprocal of the frequency generation response, and indicative of the phase relationship between a reference frequency and the scaled, synthesized frequency; and filtering the control signal, whereby the interaction of the phase relationship control signal response and the frequency generation response approximates a flat modulation response.

Thus, there has been provided a relatively low cost, constant gain, wide bandwidth frequency synthesizer having a relatively flat modulation response over the entire VCO steering line voltage range.

BRIEF DESCRIPTION OF THE DRAWINGS

Additional objects, features, and advantages, in accordance with the present invention, will be more clearly understood, by way of unrestricted example, from the following detailed description, taken together with the accompanying drawings, in which:

FIG. 1 is a block diagram of a typical digital phase-locked loop frequency synthesizer.

FIG. 2 is a timing diagram illustrating waveforms at various points in the diagrams.

FIG. 3 is a symbolic representation of the charge pump in accordance with the present invention.

The invention will be readily appreciated by reference to the detailed description when considered in conjunction with the accompanying drawings in which like reference numerals designate like parts throughout the Figures.

THE DESCRIPTION OF THE PREFERRED EMBODIMENT

Figure 4:
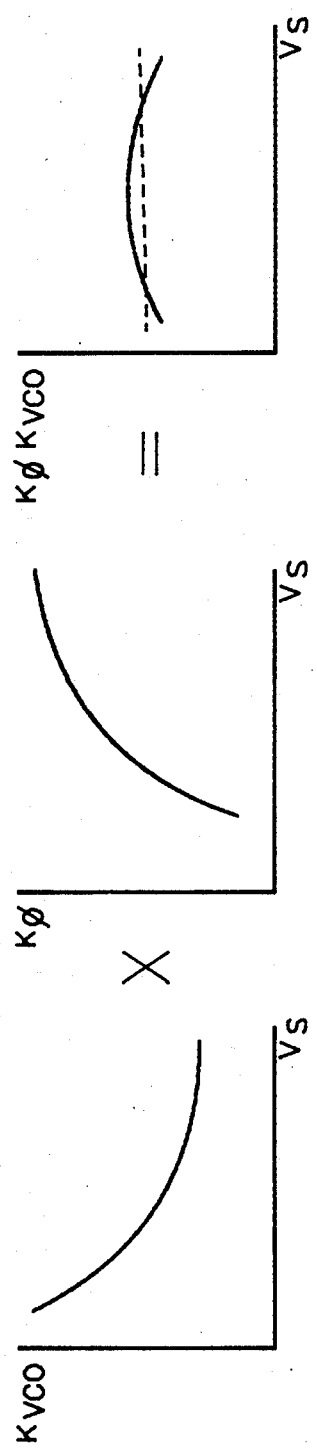
FIG. 4 is a graphical illustration of the loop gain response according to the present invention.

As illustrated in FIG. 1, digital frequency synthesizers commonly employ standard phase-locked loop circuitry wherein a Voltage Controlled Oscillator (VCO) signal $F_0$ is divided by a loop divisor N. The output of the loop divisor $F_n$ is compared to a reference frequency signal $F_r$ in a phase detector. A charge pump generates a charging current $I_\phi$ whose duration is proportional to the phase difference detected. The charging current $I_\phi$ is utilized to charge capacitive elements C in the loop filter, thereby developing a steering line control voltage $V_s$ for the Voltage Controlled Oscillator (VCO). Further, the filter assists in maintaining the synthesized frequency $F_0$ by reducing its sensitivity to sporadic disturbances or perturbations. The result is that the phase-locked loop operates to acquire, and then maintain, the Voltage Controlled Oscillator (VCO) frequency as an integral multiple (N) of a reference frequency $F_r$. Thus, a synthesized frequency $F_0$ is generated by a Voltage Controlled Oscillator (VCO) and is proportional to the control voltage on its input $V_s$.

In order to generate one of a number of desired synthesized frequencies, the synthesized frequency $F_0$ is scaled by a divisor N. The divisor N is chosen to correspond to the desired synthesized frequency. In order to change the desired synthesized frequency, it is well known in the art to provide a programmable divisor.

To lock to the new frequency, the scaled synthesized frequency $F_n$ is compared to a reference frequency signal $F_r$ in a phase detector. The reference frequency $F_r$ can be provided by any suitable frequency generator. The phase detector generates signals indicative of the phase relationship between the reference frequency $F_r$ and the scaled, synthesized frequency $F_n$.

In the preferred embodiment, the phase detector is a digital, three-state phase detector and charge pump of the type generally described in Motorola Semiconductor Products' MC43440MC4044 literature, 1972. As can be seen from the wave forms of FIG. 2, a pulse, whose duration is proportional to the phase difference, is produced when the synthesized frequency $F_0$ must be brought up from its current frequency while a pulse of similar duration is produced when the synthesized frequency $F_0$ must be brought down from its current value. A steady state signal is produced when the synthesized frequency $F_0$ is at its desired value and no phase difference exists.

Returning again to FIG. 1, a charge pump generates a charging or discharging current $I_\phi$ and supplies it to the capacitive elements C of the loop filter in response to the up and down pulses received from the digital phase detector. This current control signal $I_\phi$ charges or discharges the capacitive elements C in the loop filter thereby generating a control voltage $V_s$ for the Voltage Controlled Oscillator (VCO).

Further, the combination of resistive R and capacitive C elements in the loop filter provide a filtering time constant by which sporadic disturbances or perturbations are suppressed.

As illustrated in FIG. 3, the charge pump can be symbolically represented by a current source and a current sink switched by the phase detector. A current source is provided for charging the capacitive elements C of the loop filter and thereby generate a steering line voltage control signal $V_s$ for the Voltage Controlled Oscillator (VCO). Similarly, a current sink is provided to discharge the capacitive elements C of the loop filter to reduce the steering line voltage control signal $V_s$.

Figure 5:
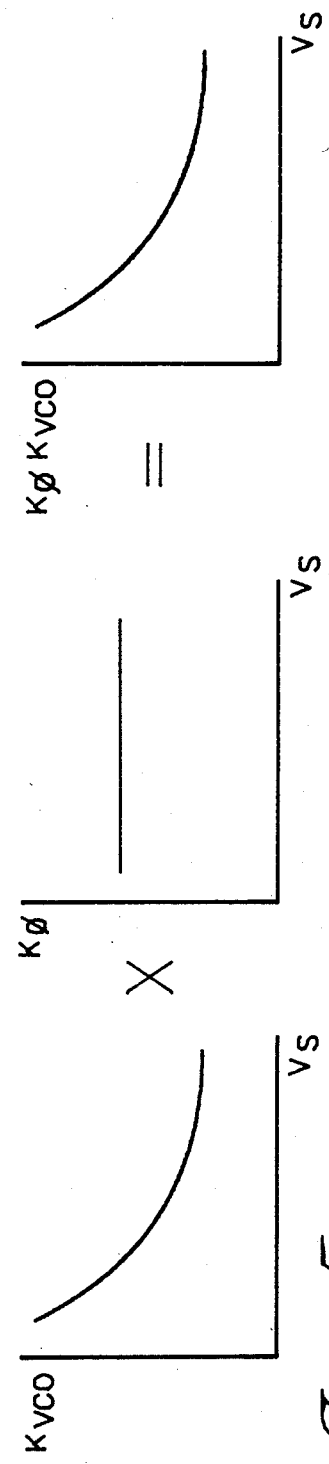
FIG. 5 is a graphical illustration of a typical loop gain response.

To realize a relatively flat modulation response, it is necessary to keep the closed loop gain of the frequency synthesizer nearly constant over the steering line control voltage range $V_s$ (FIG. 4). This frequency synthesizer loop gain is proportional to the product of the phase detector gain $K_\phi$ and the Voltage Controlled Oscillator VCO gain $K_{VCO}$. However, in wideband Voltage Controlled Oscillators (VCOs), significant modulation, lock time and loop stability problems are introduced due to nonlinearities-the VCO gain $K_\phi$ decreases with increasing steering line voltage $V_s$ (FIG. 5). Linearization of the VCO is a relatively expensive proposition. Previously, attempts were made to reduce this problems through linearization networks to reduce the sensitivity to steering line voltage variations. However, as the Voltage Controlled Oscillator VCO operating bandwidth increases, these networks cannot reduce the (typically 100%) VCO gain variation to acceptable levels.

The instant invention solves these problems by flattening the modulation response by providing constant gain of the overall frequency synthesizer loop gain through compensation of the nonlinear VCO gain with a substantially reciprocal or multiplicatively inverse gain (FIG. 4).

Figure 6:
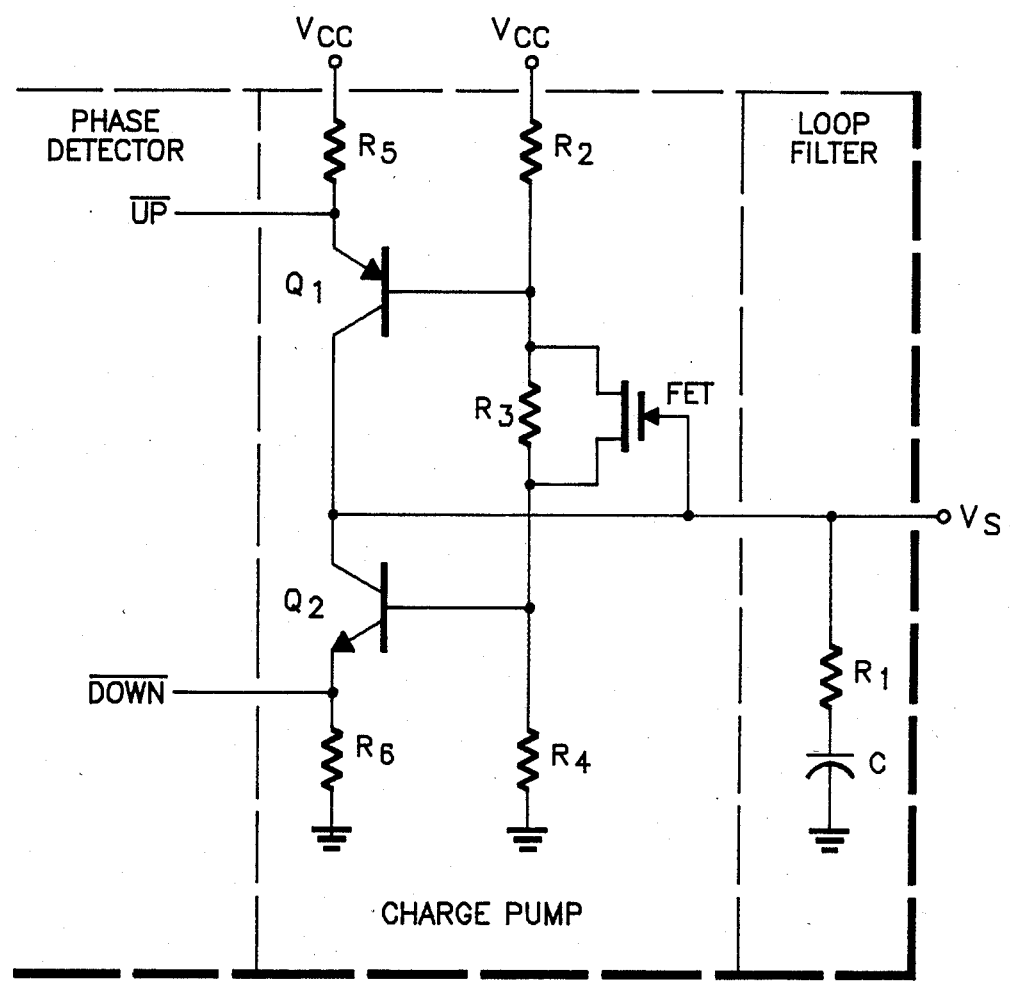
FIG. 6 is a circuit diagram of the preferred embodiment according to the present invention.

FIG. 6 is a circuit diagram of the preferred embodiment according to the present invention. When the Voltage Controlled Oscillator VCO is locked on the desired frequency $F_0$, the steering line control voltage $V_s$ is at a steady state value. This steady state voltage on the gate of the Field Effect Transistor FET provides a steady state source-to-drain resistance, which, when paralleled with resistor $R_3$, establishes a voltage divider ladder through $R_2$ and $R_4$. Correspondingly, the voltages across $R_2$ and $R_4$ are, roughly, equal to those across $R_5$ and $R_6$.

When the Voltage Controlled Oscillator (VCO) is changed in frequency, the phase detector furnishes a phase indicative pulse, up or down, causing the corresponding charge pump $Q_1/Q_2$ to supply current to or sink current from the steering control line $V_s$.

As the steering line voltage $V_s$ increases, the Field Effect Transistor FET becomes more conductive, effectively lowering the resistance of $R_3$. This reduced resistance increases the current through the voltage ladder, increasing the voltage across $R_2$ and $R_4$ and, thus, the voltages across $R_5$ and $R_6$ and, in turn, increasing the current gain in both the upper $Q_1$ and lower $Q_2$ charge pumps. Thus, the phase detection gain $K_\phi$ increases with increasing steering line voltage. Since non-linearized Voltage Controlled Oscillators (VCOs) have decreasing gain $K_{VCO}$ with increasing steering line voltage, the overall loop gain product $K_\phi \times K_{VCO}$ is nearly constant and, therefore, more stable and provide a flatter modulation response.

Thus, there has been provided a constant gain, wide bandwidth frequency synthesizer.

Further, there has been provided a relatively low cost, constant gain, wide bandwidth frequency synthesizer having a relatively flat modulation response over the entire VCO steering line voltage range.

It will be appreciated by those skilled in the art of phase-locked loop frequency synthesizers that this invention is not limited to use with charge pump phase detectors, but may also be applied to op-amp loop filters whose gain may be altered by steering line voltage feedback. Similarly, more complex compensation networks utilizing multiple FETs, MOSFETs, A/D converters, nonlinear divider networks, etc. may be employed to reciprocally compensate for nonlinear VCO gain responses.

The foregoing description of the various embodiments are merely illustrative of the broad inventing concept comprehended by the invention and has been given for clarity of understanding by way of unrestricted example. However, it is not intended to cover all changes and modifications which do not constitute departures from the spirit and scope of the invention.

What I claim and desire to secure by Letters Patent is:

1. A method of substantially flattening modulation response in a frequency synthesizer having a reference frequency and a variable frequency generator having a gain response that varies in response to an input parameter, comprising the steps of:
   providing a charge pump having:
      an output;
      a current source for providing a charging current at said output, said current source having a controllable gain that is responsive to said output; and
      a current sink for providing a discharging current at said output, said current sink having a controllable gain that is responsive to said output;
   providing a loop filter;
   providing a control signal to said variable frequency generator to cause generation of a synthesized frequency;
   scaling said synthesized frequency with a scalar to produce a scaled synthesized frequency;
   detecting any phase difference between said scaled synthesized frequency and said reference frequency, and providing a phase detection signal related to said difference;
   providing said phase detection signal to said charge pump current source when a phase difference in a first direction is sensed to cause provision of said charging current at said output;
   providing said phase detection signal to said charge pump current sink when a phase difference in a second direction is sensed, said second direction being opposite to said first direction, to cause provision of said discharging current at said output;

providing said output of said charge pump to said loop filter to thereby develop said control signal having a gain response substantially the reciprocal of said gain response of said variable frequency generator;

whereby the interaction of said variable frequency generator and said charge pump approximates a flat modulation response.

2. The method of claim 1 wherein the step of providing said charge pump current source also includes providing a first transistor.

3. The method of claim 2 wherein the step of providing said charge pump current sink also includes providing a second transistor.

4. The method of claim 1 wherein the step of providing a current source and a current sink, each having a controllable gain that is responsive to the output of said charge pump, also includes the provision of an FET having a gate connected to respond to said output and power terminals connected to control biasing of said current source and said current sink to thereby control the gain of said current source and said current sink.

5. A method of substantially flattening modulation response in a frequency synthesizer having a reference frequency and a variable frequency generator having a gain response that varies in response to an input parameter, comprising the steps of:

providing a charge pump having:
 an output;
 an FET having a gate connected to said output;
 a first transistor that can provide a charging current at said output, said first transistor having a base that connects to a power terminal of said FET and through a first resistor to a voltage source; and
 a second transistor that can providing a discharging current at said output, said second transistor having a base that connects to another power terminal of said FET and through a second resistor to ground;

providing a loop filter;

providing a control signal to said variable frequency generator to cause generation of a synthesized frequency;

scaling said synthesized frequency with a scalar to produce a scaled synthesized frequency;

detecting any phase difference between said scaled synthesized frequency and said reference frequency, and providing a phase detection signal related to said difference;

providing said phase detection signal to said charge pump current source when a phase difference in a first direction is sensed to cause provision of said charging current at said output;

providing said phase detection signal to said charge pump current sink when a phase difference in a second direction is sensed, said second direction being opposite to said first direction, to cause provision of said discharging current at said output;

providing said output of said charge pump to said loop filter to thereby develop said control signal having a gain response substantially the reciprocal of said gain response of said variable frequency generator;

whereby the interaction of said variable frequency generator and said charge pump approximates a flat modulation response.

6. The method of claim 5 wherein the step of providing said FET also includes providing a third resistor across said power terminals.

* * * * *